United States Patent
Huott et al.

(10) Patent No.: US 6,625,769 B1
(45) Date of Patent: Sep. 23, 2003

(54) METHOD FOR IC FAULT ANALYSIS USING PROGRAMMABLE BUILT-IN SELF TEST AND OPTICAL EMISSION

(75) Inventors: William V. Huott, Holmes, NY (US); Moyra K. Mc Manus, Croton-on-Hudson, NY (US); Pia Naoko Sanda, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 09/703,803

(22) Filed: Nov. 1, 2000

Related U.S. Application Data
(60) Provisional application No. 60/165,041, filed on Nov. 12, 1999.

(51) Int. Cl.$^7$ ............................................. H04B 17/00
(52) U.S. Cl. ...................................... 714/733; 714/725
(58) Field of Search .............................. 714/733, 725; 365/201

(56) References Cited

U.S. PATENT DOCUMENTS

| | | | |
|---|---|---|---|
| 5,633,877 A | | 5/1997 | Shephard, III et al. |
| 5,659,551 A | | 8/1997 | Huott et al. |
| 6,003,150 A | * | 12/1999 | Stroud et al. ............... 714/725 |
| 6,067,262 A | * | 5/2000 | Irrinki et al. ............... 365/201 |
| 6,122,760 A | * | 9/2000 | Grosch et al. .............. 714/724 |
| 6,202,182 B1 | * | 3/2001 | Abramovici et al. ........ 714/725 |
| 6,367,042 B1 | * | 4/2002 | Phan et al. ................. 714/733 |

OTHER PUBLICATIONS

Foote et al., "Testing the 400 MHz IBM Generation-4 CMOS Chip", Proceedings of the IEEE International Test Conference, pp. 106–114, 1997.

Foote et al., "Microprocessor Test and Test Tool Methodology for the 500 MHz IBM SD/390 G5 Chip", Proceedings of the IEEE International Test Conference, pp. 717–726, 1998.

Kash et al., "Dynamic Internal Testing of CMOS Circuits Using Hot Luminescence", IEEE Electron Device Letters, vol. 19, No. 7, pp. 330–332, Jul. 1997.

Casal et al., "Picosecond Imaging Circuit Analysis of the Power3 Clock Distribution", Digest of the IEEE International Solid–State Circuits Conference, pp. 372–373, Jun. 1999.

Kash et al., "Full Chip Optical Imaging of Logic State Evolution in CMOS Circuits", International Electron Devices Meeting (IEDM) Late News Paper pp. 1–3, Apr. 1996.

* cited by examiner

Primary Examiner—Phung M. Chung
(74) Attorney, Agent, or Firm—F. Chau & Associates, LLP

(57) ABSTRACT

A method is provided for analyzing the functionality of an integrated circuit (IC). The method includes the step of applying a built-in self test (BIST) to the integrated circuit. The BIST includes a plurality of tests that result in the integrated circuit passing and/or failing with respect to predefined criteria. During the applying step, a substrate current of the integrated circuit is measured and analyzed as a function of at least one variable. Also during the applying step, optical emissions of the integrated circuit are measured and analyzed. Defects in the functionality of the integrated circuit are identified, based on at least one of the substrate current and the optical emissions.

31 Claims, 14 Drawing Sheets

METHOD FOR IC FAULT ANALYSIS USING PROGRAMMABLE BUILT-IN SELF TEST AND OPTICAL EMISSION

RELATED APPLICATION DATA

This is a non-provisional application claiming the benefit of provisional application Ser. No. 60/165,041, filed on Nov. 12, 1999, the disclosure of which is incorporated by reference herein.

BACKGROUND

1. Technical Field

The present invention relates generally to integrated circuits (ICs) and, in particular, to a method for IC fault analysis using programmable built-in self test and optical emission.

2. Background Description

The invention described herein resulted from a debug problem referred to as the "Holey Shmoo problem". The problem developed during the design of the IBM System/390 G6 637 MHz microprocessor chip. The problem and the methodology used to successfully solve the problem will be described herein.

Shmoo plotting began in the early 1970's and has since been widely used in characterizing device performance against various parameters. Shmoo plotting (in test characterizations) probably took its name based on either the appearance or the eternally obliging nature of Al Capp's cartoon figure Shmoo", as noted by Baker et al., in "Shmoo Plotting: The Black Art of IC Testing", IEEE Design & Test of Computers, pp. 90–97 July–September 1997.

Common to characterization is the Shmoo plotting of a device's frequency performance or cycle time vs. voltage. The "Holey Shmoo" debug focused on problems (holes) in this type of Shmoo plot. This problem has 2 distinct phases as the microprocessor design was migrated from an older CMOS process technology into a newer, faster one.

A description of the problem will now be given. The IBM System/390 G6 microprocessor chip is used in the S/390 G6 mainframe computer system which was released in May 1999. The speed of this processor is 555 MHz (1.8 ns cycle) for the "Standard" systems and 637 MHz (1.57 ns cycle) for the faster "Turbo " systems. The L1 Cache embedded SRAM core on this microprocessor exhibited a peculiar cycle-time limitation that came to be described as the "Holey Shmoo Problem".

FIGS. 1A and 1B are programmable built-in self test (RAMBIST) Shmoo plots for the same integrated circuit, which illustrate the "Holey Shmoo" behavior of the L1 Cache embedded static random access memory (SRAM). The plots are of cycle time versus voltage. The on chip cycle time is ⅛th the time shown on the x-axis (ns).

The net of the problem was that the L1 Cache embedded SRAM was not meeting its cycle time specification. Specific RAMBIST Shmoos of the phenomenon were intermittent (holey) with voltage and cycle time. The degraded cycle time was restricted only to consecutive write patterns to the L1 Cache and did not seem to affect the several other embedded SRAMs on the chip. The L1 Cache SRAM began to intermittently fail when repeated data write patterns were applied to it at faster cycle times. The failure point occurred at much slower cycle times than were anticipated resulting in much slower pass/fail Shmoo plots which contained many non-repeatable holes at the pass/fail boundary. This is how the problem gained its unique name.

The problem was first seen in the IBM CMOS6X (0.25 um) process technology and appeared to be defect based. FIGS. 2A and 2B RAMBIST Shmoo plots for a normal and a "Holey Shmoo" IC, respectively, wherein the two ICs both have the same potential speed based on their flush delays. Flush delay is a method of measuring chip potential speed by measuring the propagation delay of a signal through a long chain of scannable latches which have their scan clocks held on, i.e. flushing. Chips with identical flush delays should perform very similarly in most speed based tests, barring any defects. Here, one chip appears to be "normal" while the other exhibits the "Holey Shmoo problem". The right most portion of the Shmoo plots indicate where all tests pass, the black portion is where the Logic BIST (LBIST) speed test began to fail, and the white portion is where the RAMBIST test failed due to the L1 Cache SRAM. LBIST is further described by Foote et al., in "Testing the 400 MHz IBM Generation-4 CMOS Chip", Proceedings of the IEEE International Test Conference, pp. 106–114, 1997; and Foote et al., in "Microprocessor Test and Test Tool Methodology for the 500 MHZ IBM S 390 G5 Chip", Proceedings of the IEEE International Test Conference, pp. 717–726, 1998. The holes in the RAMBIST fails have been filled-in by running many RAMBIST tests targeting the problem, and overlaying their pass/fail results. The Logic BIST (LBIST) failing cycle times are nearly identical while the RAMBIST failing cycle times for the L1 Cache SRAMs differ by over 300 ps (on chip). This difference is apparently defect-based. On-chip cycle time is ⅛th the x-axis time (ns).

SUMMARY OF THE INVENTION

The problems stated above, as well as other related problems of the prior art, are solved by the present invention, a method for IC fault analysis using programmable built-in self test and optical emission.

In a first aspect of the invention, there is provided a method for analyzing the functionality of an integrated circuit (IC). The method includes the step of applying a built-in self test (BIST) to the integrated circuit. The BIST includes a plurality of tests that result in the integrated circuit passing and/or failing with respect to predefined criteria. During the applying step, a substrate current of the integrated circuit is measured and analyzed as a function of at least one variable. Also during the applying step, optical emissions of the integrated circuit are measured and analyzed. Defects in the functionality of the integrated circuit are identified, based on at least one of the substrate current and the optical emissions.

In a second aspect of the invention, the at least one variable includes at least one of a clock frequency of the integrated circuit, an operating voltage of the integrated circuit, and a temperature associated with the integrated circuit.

In a third aspect of the invention, the step of measuring and analyzing the substrate current is performed for different values of the at least one variable.

In a fourth aspect of the invention, the step of applying the BIST includes the step of continuously repeating the plurality of tests.

In a fifth aspect of the invention, the step of applying the BIST includes the step of applying a continuously repeating and programmable random access memory built-in self test (RAMBIST) to the integrated circuit.

In a sixth aspect of the invention, the step of applying the RAMBIST includes the step of monitoring an occurrence of a fault in the integrated circuit, using a real time error bit in the RAMBIST.

In a seventh aspect of the invention, the step of measuring and analyzing the optical emissions includes the step of characterizing a timing fault, based upon the optical emissions being time resolved.

In an eighth aspect of the invention, the step of measuring and analyzing the optical emissions includes the step of minimizing attenuation of the optical emissions.

In a ninth aspect of the invention, wherein the optical emissions include time resolved and time integrated optical emissions and the step of measuring and analyzing the optical emissions includes the step of comparing the time resolved and time integrated optical emissions against a simulation of the integrated circuit.

In a tenth aspect of the invention, the step of measuring and analyzing the optical emissions includes the step of playing back the optical emissions as a slow motion movie.

In an eleventh aspect of the invention, the step of measuring and analyzing the optical emissions includes the step of determining the optical emissions using at least one of a photomultiplier, an infrared (IR) measuring device and a charge-coupled device (CCD).

In a twelfth aspect of the invention, the step of measuring and analyzing the optical emissions includes the step of determining the optical emissions using an infrared (IR) measuring device and at least one of a photomultiplier for time resolved detection of the optical emissions, and a charge-coupled device (CCD) for time integrated detection of the optical emissions.

In a thirteenth aspect of the invention, the step of measuring and analyzing the optical emissions includes the step of analyzing individual emission spots with respect to a design layout of the integrated circuit, each of the spots including at least one pixel.

In a fourteenth aspect of the invention, the step of measuring and analyzing the optical emissions includes the step of extracting optical waveforms.

In a fifteenth aspect of the invention, the plurality of tests are executed for different values of at least one of a clock frequency of the integrated circuit, an operating voltage of the integrated circuit, and a temperature associated with the integrated circuit.

In a sixteenth aspect of the invention, the method further includes the step of subtracting results of the plurality of tests executed at different frequencies.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1A:
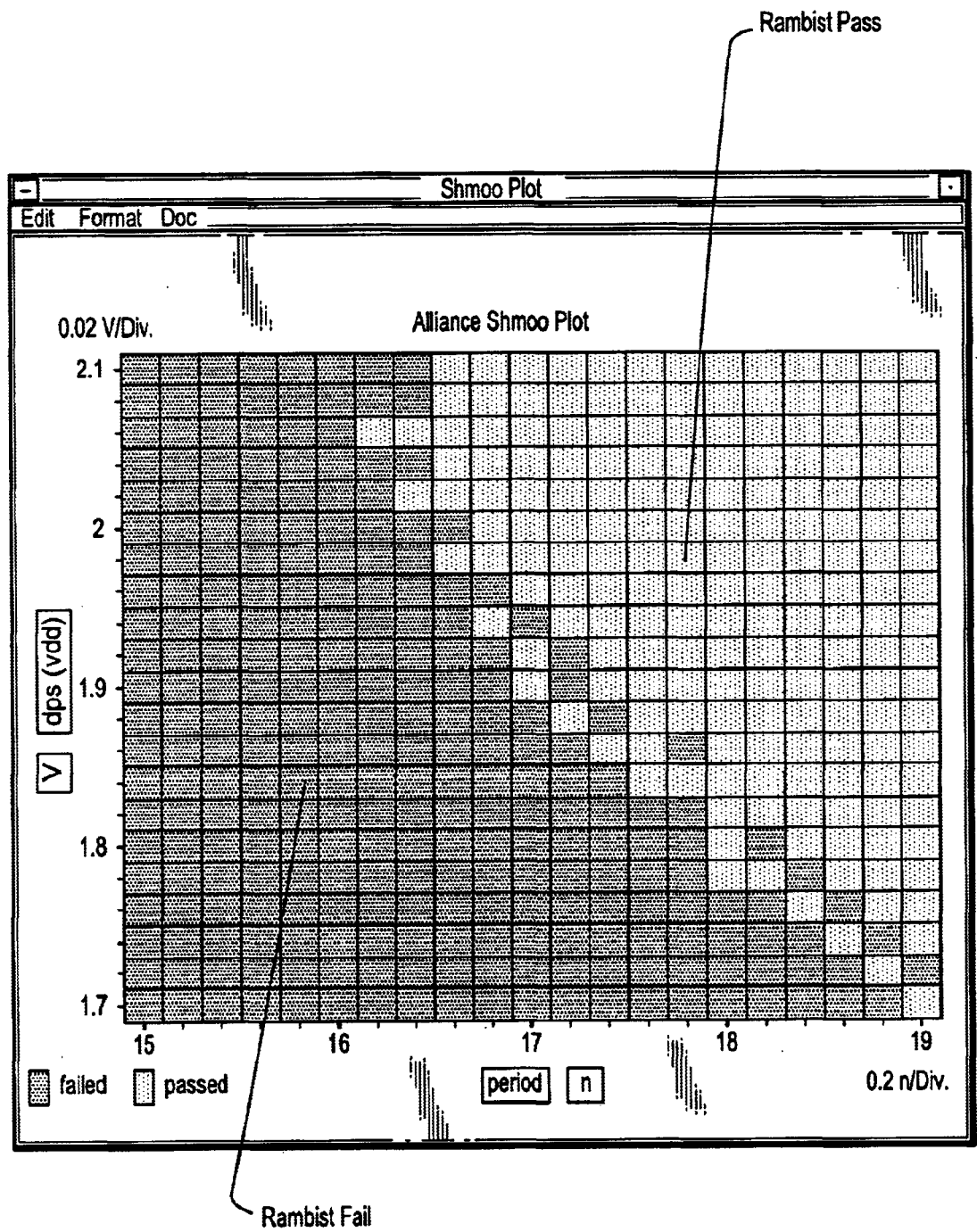
FIGS. 1A and 1B are programmable built-in self test (RAMBIST) Shmoo plots for the same integrated circuit, which illustrate the "Holey Shmoo" behavior of the L1 Cache embedded static random access memory (SRAM)
Figure 1B:
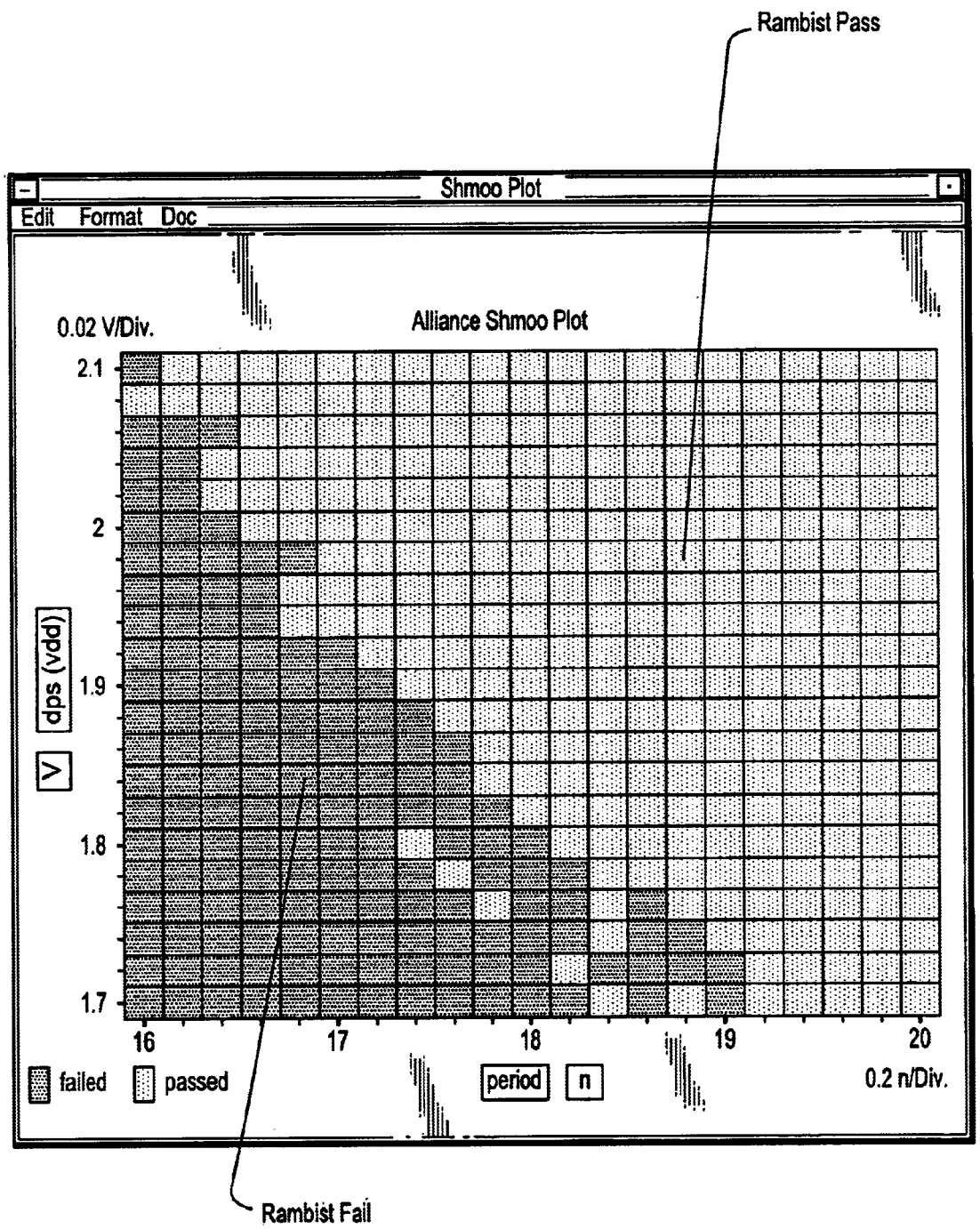
Figure 2A:
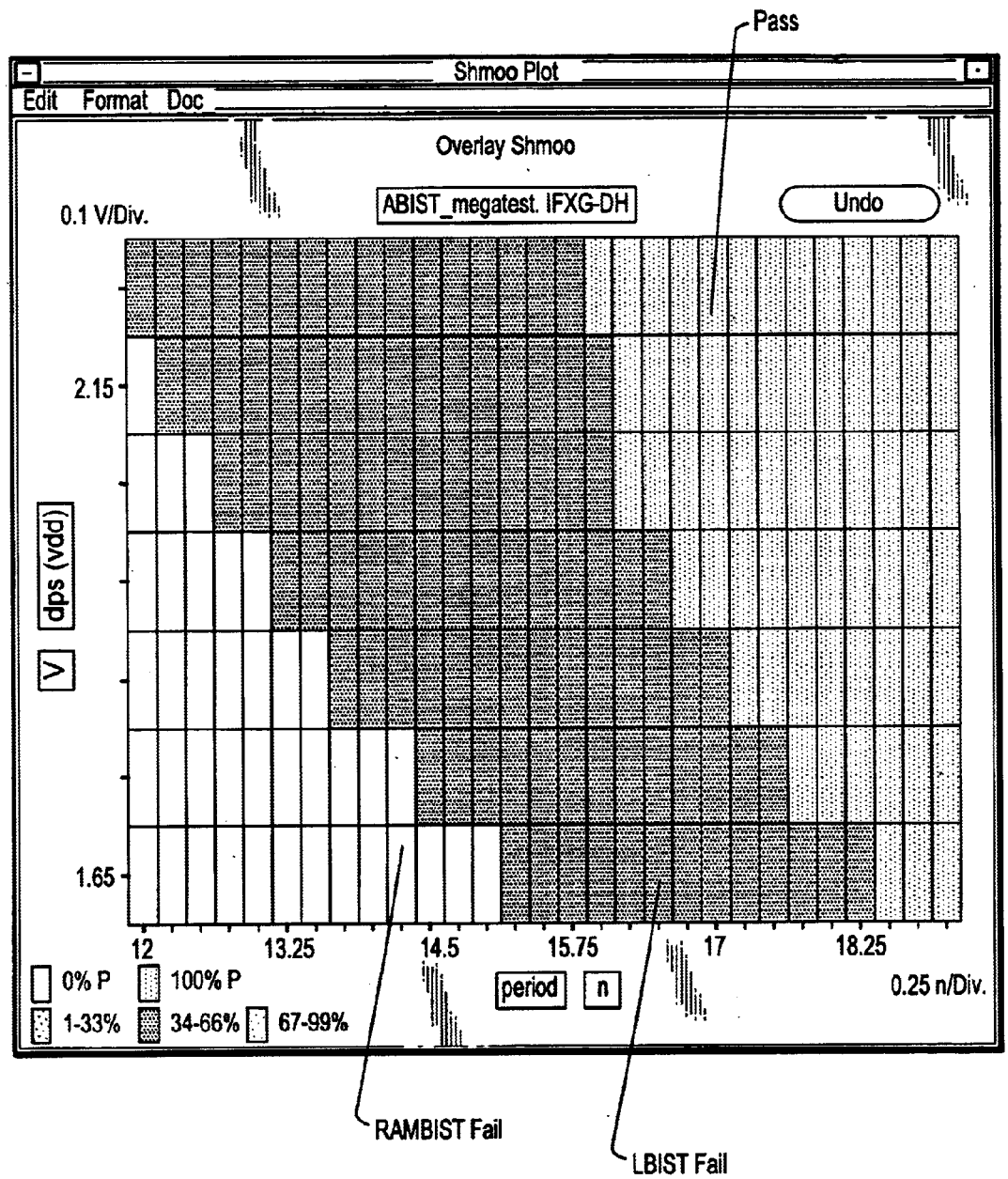
FIGS. 2A and 2B RAMBIST Shmoo plots for a normal and a "Holey Shmoo" IC, respectively, wherein the two ICs both have the same potential speed based on their flush delays.
Figure 2B:
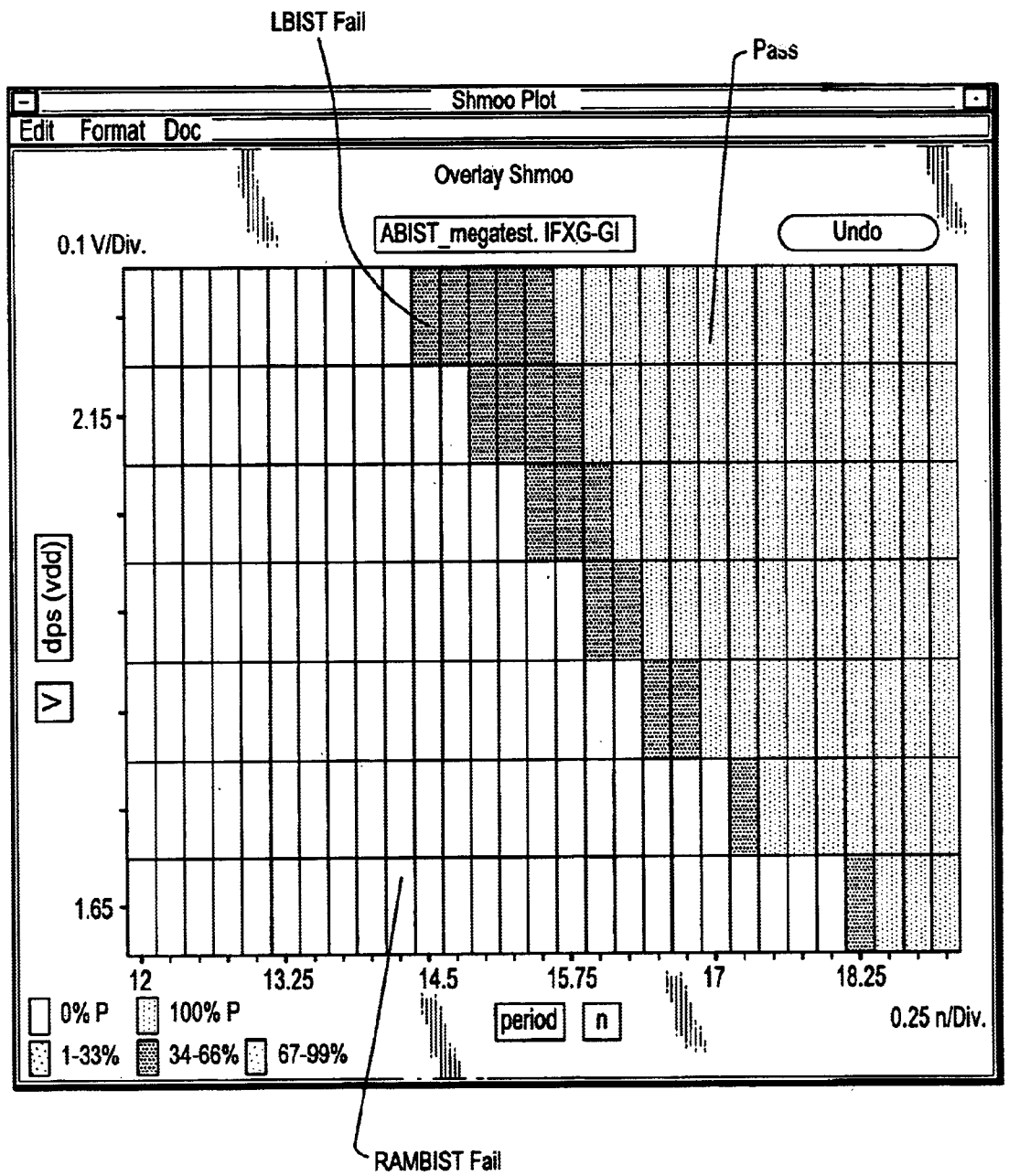

The present invention is directed to a method for IC fault analysis using programmable built-in self test and optical emission.

It is to be understood that the present invention may be implemented in various forms of hardware, software, firmware, special purpose processors, or a combination thereof. Preferably, the present invention is implemented as a combination of hardware and software, the software being an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and micro instruction code. The various processes and functions described herein may either be part of the micro instruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

A description will now be given of at speed bit fail mapping according to an illustrative embodiment of the invention. The first advanced diagnostic/DFD technique to be used was the at-speed bit fail mapping that was required to identify the defect based fails within the L1 Cache SRAM in the CMOS6Xx process. It was necessary to run these bit fail maps, in some cases at speeds faster than 1.5 ns cycle, to capture memory cells failing due to the Holey Shmoo problem. The L1 Cache SRAM self-test logic is equipped with the circuitry necessary to supply "on-the-fly" fail data required for at-speed bit fail mapping. Defects were successfully located in single and clustered SRAM cells using this technique, and a very subtle missing ion implant phenomenon was identified. Process changes and a Holey Shmoo screen test were put into place to completely eliminate the problem. Failure analysis photos were taken which illustrated a top view, a passing cell cross section, and a failing cell cross section, respectively, of the missing ion implant causing the Holey Shmoo problem (not shown). The top view photo illustrated the first physical evidence of the problem as poor silicide formation on the poly gate and source/drain diffusions of an NFET in the failing memory cell. The contamination causing this poor silicide formation also blocked the ion implant into the transistor's source and drain areas, weakening the device and causing the intermittent high frequency fail. The passing cell cross section and failing cell cross section photos respectively represented a vertical cut through passing and failing memory cells with the implant areas decorated as a dark layer at the top of the silicon. Sections of the ion implant in the failing memory cell were shown to be missing.

Figure 3:
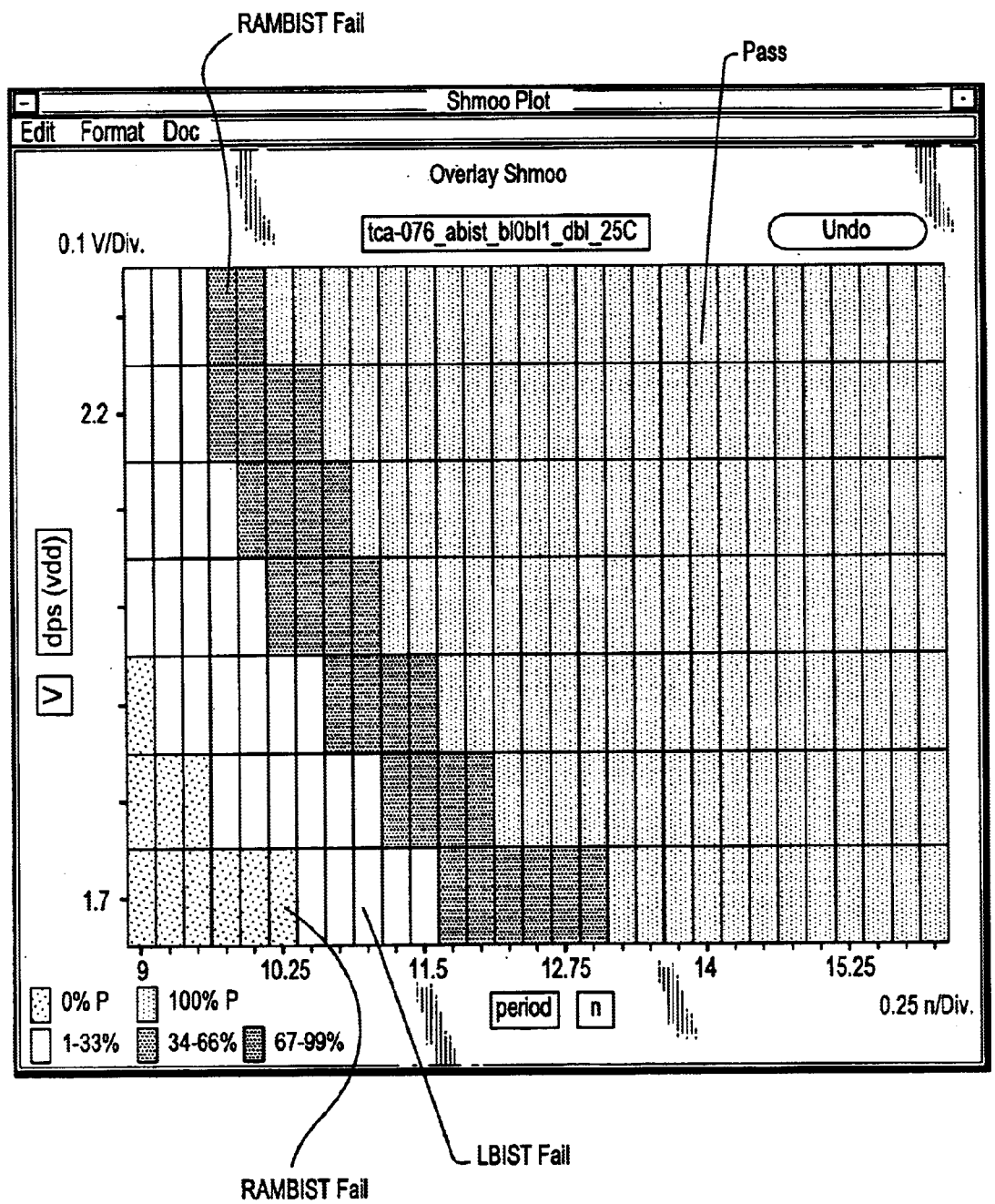
FIG. 3 is a Shmoo plot illustrating the "Mother of the Holey Shmoo" problem.

A description will now be given of what is referred to herein as the "Mother of Holey Shmoo Problem". When the L1 Cache SRAM design was migrated to the CMOS7S (0.18 um) process from the CMOS6X (0.25 um) process, the Holey Shmoo problem appeared again as an intermittent, consecutive-write, high frequency problem, but now it had gotten worse. Nearly all of the faster parts now had the problem, and it didn't appear to be defect based anymore since the fails could no longer be bit fail mapped to any specific memory cells. The fails seemed to "jump all around" the address space of the L1 Cache SRAM. The new name for this problem thus became the "Mother of Holey Shmoo" problem. It looked as though Mother of Holey Shmoo problem was going to seriously impact the Turbo (637 MHz) program since it caused the cycle time of the L1 Cache SRAM to be significantly slower than the intended logic cycle time of the microprocessor. FIG. 3 is a Shmoo plot illustrating the "Mother of the Holey Shmoo" problem. In the plot of FIG. 3, the right most portion is passing all tests, the black portion indicates where the L1 Cache SRAM failed, the white portion shows where LBIST failed, and the gray indicates where the L1 Cache SRAM fails when avoiding consecutive write patterns, as programmed into the on chip Programmable RAMBIST engine. The gray portion is where the L1 Cache SRAM should have failed with no Mother of Holey Schmoo problem. The on-chip cycle time is ⅛th the x-axis (ns).

Figure 4:
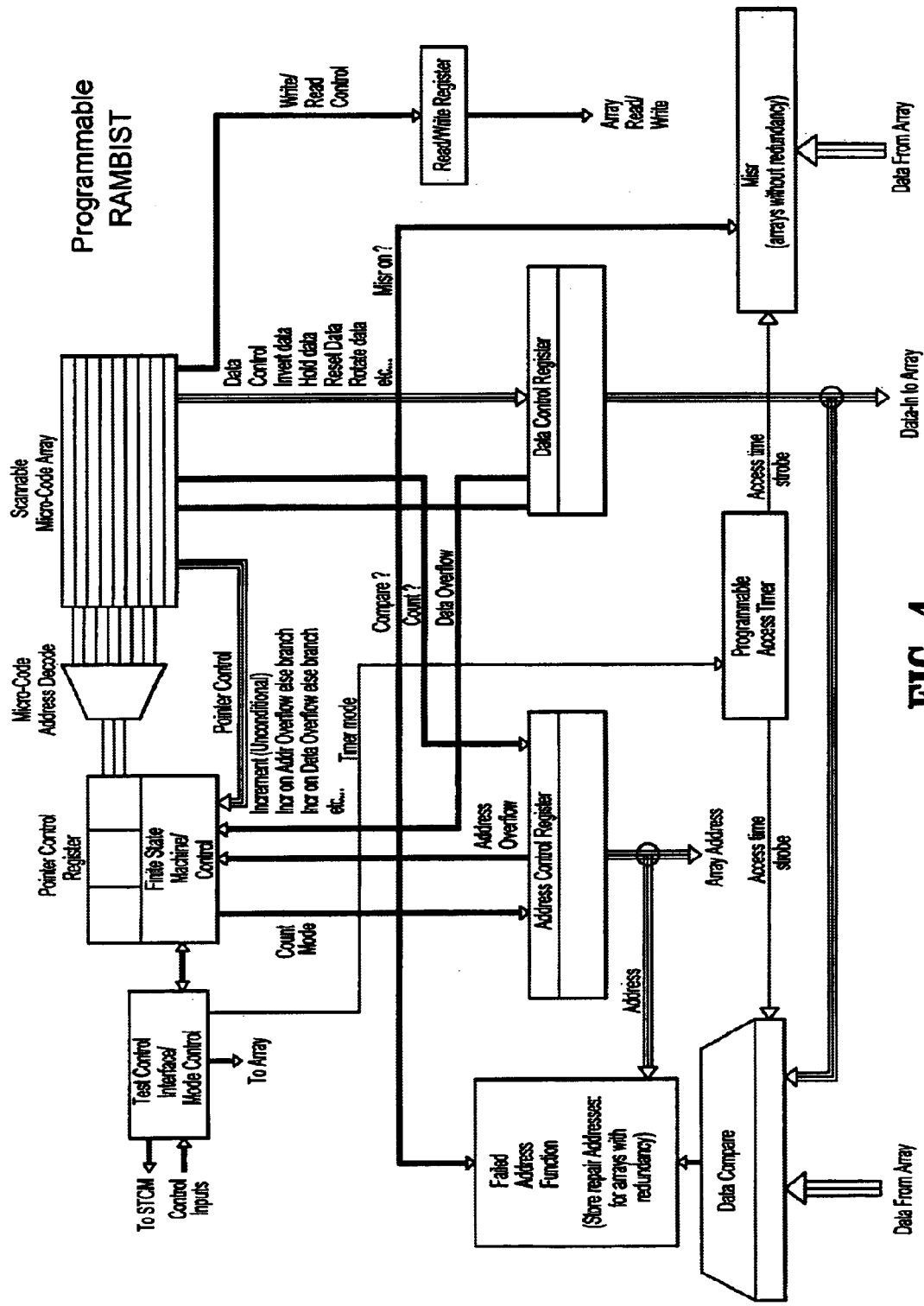
FIG. 4 is a block diagram illustrating a programmable RAMBIST design according to an illustrative embodiment of the invention.

A description will now be given of a programmable RAMBIST according to an illustrative embodiment of the invention. This is another advanced DFD feature that is built into the embedded SRAM macros. Programmable built-in self tests are further described in U.S. Pat. No. 5,633,877, entitled "Programmable Built-In Self Test Method and Controller for Arrays", issued on May 27, 1997, assigned to the assignee herein, and incorporated herein by reference; and U.S. Pat. No. 5,659,551, entitled "Programmable Computer System Element and Built-In Self Test Method and Apparatus for Repair During Power-On", issued on Aug. 19, 1997, assigned to the assignee herein, and incorporated herein by reference. The RAMBIST design of the invention serves both as a production level self-test engine as well as a testchip style characterization structure. It provides self-test and system functions all the way from wafer tests through system test and on through to the customer's office. The programmable RAMBIST engine functions more like a test microprocessor than a finite state machine. The RAMBIST program to be applied is scanned into a custom micro-code array and each instruction is decoded and executed by the RAMBIST microprocessor. The use of these programmable functions isolated the exact failing conditions of the Holey Shmoo problem (only consecutive writes, etc.). More diagnostic (DFD) features of the programmable RAMBIST engine are described hereinbelow. FIG. 4 is a block diagram illustrating a programmable RAMBIST design according to an illustrative embodiment of the invention. The programmable RAMBIST design was implemented with microprocessor-like function, as described by in U.S Pat. Nos. 5,633,877 and 5,659,551 referenced above. The RAMBIST "test program" to be applied is scanned into a custom micro-code array, and each instruction is decoded, executed, and applied to the memory under test by the RAMBIST microprocessor. The programmable RAMBIST includes a micro-code array, a pointer control macro, an address control macro, a data control macro, a read/write control macro, a result compression macro, a test control interface, and an access timer macro.

The micro-code array is a scannable register array that contains the RAMBIST program to be executed (typically eight instructions). The pointer control macro is a register that controls the address of the RAMBIST instruction being executed. The address control macro is a register that controls the address to be applied to the memory under test. The data control macro is a register that controls the data to be applied to the memory under test. The read/write control macro is a register that controls the read/write mode to be applied to the memory under test. The result compression macro are registers that either log pass/fail results and failing address data or store a passing/failing signature on the basis of the memory outputs (i.e. failed address function or MISR (Multiple Input Signature Register)). The test control interface is logic which communicates with the central test logic and controls the test modes of the memory under test. The access timer macro is a digitally programmable timer which measures the access time of the memory under test.

Figure 5A:
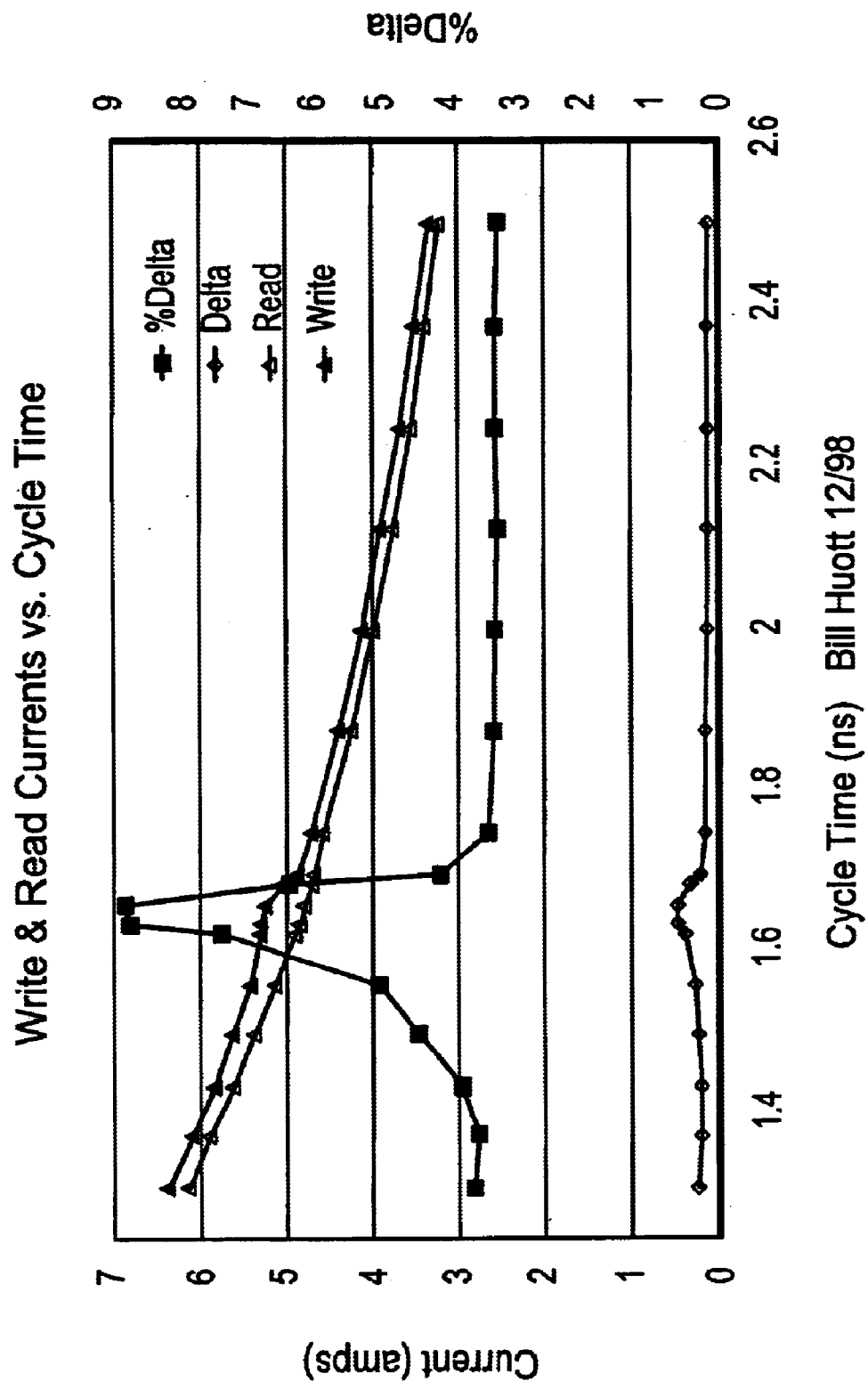
FIG. 5A is a plot of the write and read current versus cycle time for the L1 Cache SRAM, according to an illustrative embodiment of the invention.
Figure 5B:
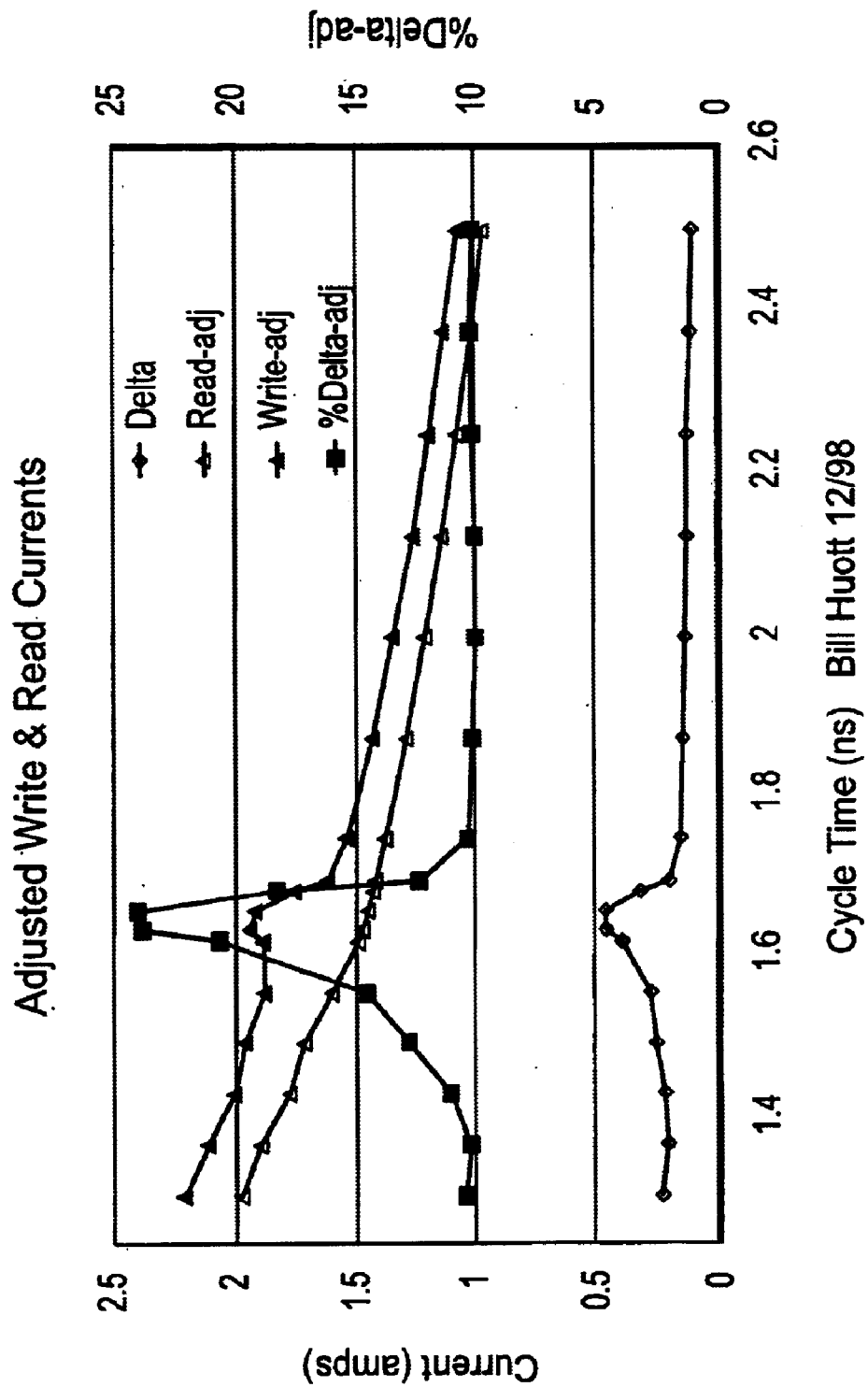
FIG. 5B is a plot of the adjusted write and read current versus cycle time for the L1 Cache SRAM, according to an illustrative embodiment of the invention.

The programmable RAMBIST engine was used to highlight a peculiar "write current kink" which appeared as a peak in the current drawn by the L1 Cache SRAM at the failing cycle time. This "kink" was only visible during a specific consecutive-write pattern programmed into the RAMBIST engine. FIG. 5A is a plot of the write and read current versus cycle time for the L1 Cache SRAM, according to an illustrative embodiment of the invention. FIG. 5B is a plot of the adjusted write and read current versus cycle time for the L1 Cache SRAM, according to an illustrative embodiment of the invention. In particular, FIG. 5A illustrates the current drawn by the chip during RAMBIST consecutive read and consecutive write patterns. Also shown are the delta and the %delta between the current drawn by the consecutive read and consecutive write patterns. Adjusting the current (in FIG. 5b) for only what was drawn by the failing L1 Cache shows a dramatic peak occurring in the consecutive write pattern at the failing cycle time, indicating a serious circuit malfunction.

A description will now be given of picosecond imaging circuit analysis (PICA) according to an illustrative embodiment of the invention. A major diagnostic technique used in debugging the Mother of Holey Shmoo problem was Picosecond Imaging Circuit Analysis (PICA). The use of PICA for measuring the internal timings of CMOS circuits has been described previously by Kash et al., in "Dynamic Internal Testing of CMOS Circuits Using Hot Luminescence", III Electron Device Lett., Vol. 18, pp. 330–332, 1997. The system used for the present measurements utilized a microchannel photomultiplier (MCP) attached to an infrared (IR) confocal laser scanning microscope (LSM). A second optical port housed a charge-coupled device (CCD) detector for time integrated emission measurements. The light path could be switched between LSM, CCD and MCP modes without moving the chip. The measurements were performed from the backside of the chip, allowing direct measurement of the flip-chip packaged device under normal test conditions. Since the amount of light emitted is small, the chip was thinned to approximately 60 um (approximately half the thickness of a human hair) to minimize absorption through the doped silicon, and the test pattern was exercised repeatedly. PICA and testing using luminescence is described by Kash et al., in "Dynamic Internal Testing of CMOS Circuits Using Hot Luminescence", III Electron Device Lett., Vol. 18, pp. 330–332, 1997; and Casal et al., in "Picosecond Imaging Circuit Analysis of the POWER 3 Clock Distribution", Digest of the IEEE International Solid-State Circuits Conference 372, 1999. Integration times were approximately 10 minutes for the CCD measurements. The MCP measurements required approximately 10 hours of integration for optimal signal-to-noise ratio, but were typically left running overnight (about 16 hours) for convenience. The module under test was socketed in a test board with the polished surface facing the imaging optics of the PICA system.

A description will now be given of time integrated analysis according to an illustrative embodiment of the invention. The "Write Current Kink" identified by the programmable RAMBIST engine gave good reason to use time integrated imaging techniques to help identify the culprit circuits. The chip was imaged through the silicon and focus was established at the circuit structures of interest, in this case, at the L1 Cache memory control circuits. A time integrated image of the L1 Cache was taken during the RAMBIST consecutive-write pattern. The time integrated image illustrated microscopy of the chip under the consecutive-write conditions provided by the RAMBIST engine overlayed on the corresponding physical design.

Measurements under passing/slow (2.25 ns cycle) and failing/fast (1.5 ns cycle) conditions showed markedly different emission intensity in the region of the write control circuits implicating them strongly in the problem. A subtracted time integrated image of failing/fast pattern minus the passing/slow pattern was observed. The PICA measurement for the passing case was lengthened by 50% to normalize the background pattern so that the image under passing conditions (golden image) could be directly subtracted from the image under failing conditions. The subtracted image showed that the write control circuits are responsible for much of the additional current from the "write current kink" at the failing cycle time, as identified by the programmable RAMBIST.

A description will now be given of PICA timing analysis according to an illustrative embodiment of the invention. PICA measurements were also used to derive the timing behavior. This was visualized in two ways. In the first, a real image of the infrared (IR) emissions acquired over a time interval can be stored and "played back" in the form of a slow motion movie, as first shown by Kash et al., in "Full Chip Optical Imaging of Logic State Evolution in CMOS Circuits", International Electron Devices Meeting (IEDM), 1996. In the second, emission waveforms are extracted and used to measure delays. These waveforms may be compared against circuit simulation. The present measurement utilized both of these methods. First movies helped visualize the timing condition responsible for the consecutive-write error. The programmable RAMBIST engine was coded to provide an infinitely repeating 'consecutive-write' pattern that was capable of reliably triggering the Mother of Holey Shmoo failure at fast speed.

A frame from a movie taken at the 2.25 ns (slow/passing) cycle time was annotated to show the structures observed. Two write control circuits (WCON) in the bottom of the frame showed strong light emissions while the write control reset circuit (WCONRS) was "off". A line at the top of the image was attributed to the pass gates of the individual memory cells connected to the addressed wordline. Directly below the memory cells were emissions from the bit selector circuits.

A next frame from the movie taken at the 1.5 ns (fast/failing) cycle time clearly showed the failing condition. The dynamic, self-resetting WCON circuits were in direct collision with their reset delay chain WCONNRS. These 2 circuits should not be active ("lit up") at the same time. This indicates a failure. Basically, the write control reset circuit was still trying to reset the write control circuit at the beginning of the next memory access cycle (at shorter cycle times).

Simulation did not predict this WCON to WCONRS timing collision at these cycle times. Since the cycle times is so much faster, the Data Out drivers (shown directly above the WCON circuits), are still active from the previous cycle, which is expected. Emissions from the labeled Bit selectors and sense-amplifiers (samp) are not completely active in these frames but are visible in the movie.

Figure 6:
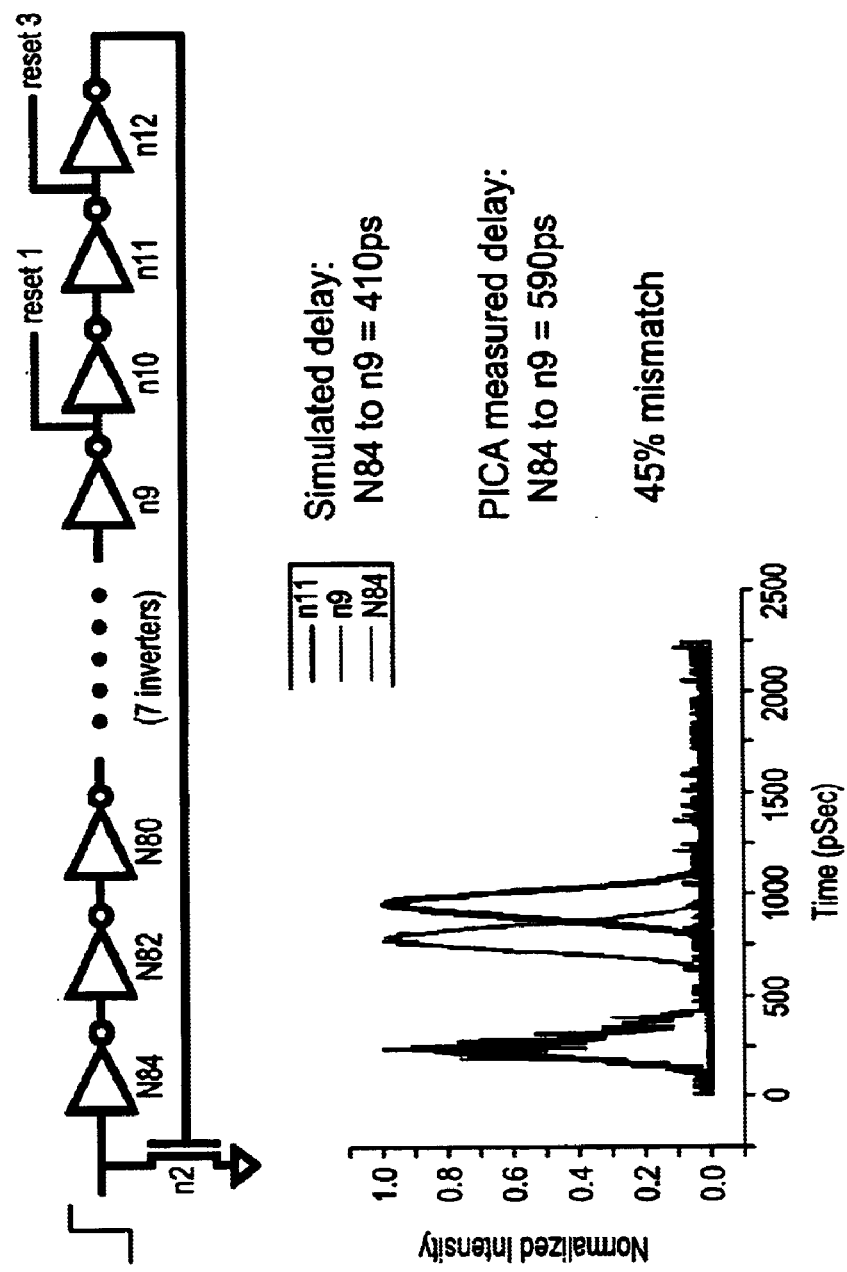
FIG. 6 illustrates the PICA waveforms and timings on the write control reset (WCONRS) circuit, according to an illustrative embodiment of the invention.

A description will now be given of PICA waveform analysis according to an illustrative embodiment of the invention. The timing of the write control reset circuit (WCONRS) inverter delay chain was further analyzed to understand the origin of the collision. FIG. 6 illustrates the PICA waveforms and timings on the write control reset (WCONRS) circuit, according to an illustrative embodiment of the invention. In particular, FIG. 6 illustrates the waveform from the NFET of the first inverter of the delay chain (N84) and the NFETs (n9 and n11) switching the levels of two outputs (reset1 and reset3, respectively). The PICA measured delay of 590 ps exceeded the simulated delay by approximately 45%. The simulation predicted no timing collision and a safe margin. Simulation model verification using the PICA delays was able to verify a model to hardware mismatch on particular transistor devices within the WCONRS inverter delay chain. These results ultimately showed that the root cause of both the Holey Shmoo Problem and the Mother of Holey Shmoo Problem resided in this same mismatched WCONRS inverter delay chain. Since the older CMOS6X design only marginally had the problem, subtle SRAM cell defects were required to bring the L1 Cache design to failure. The faster CMOS7S process had pushed the new design such that the slow inverter chain no longer needing an underlying SRAM cell defect to bring the L1 Cache to functional "AC" failure. While the simulation miss-correlation is actually quite complex, the concept of a slow inverter delay chain mismatch seems so simple that debug efforts may never have taken that direction had it not been for the PICA timing and waveform analysis highlighting the problem.

Figure 7:
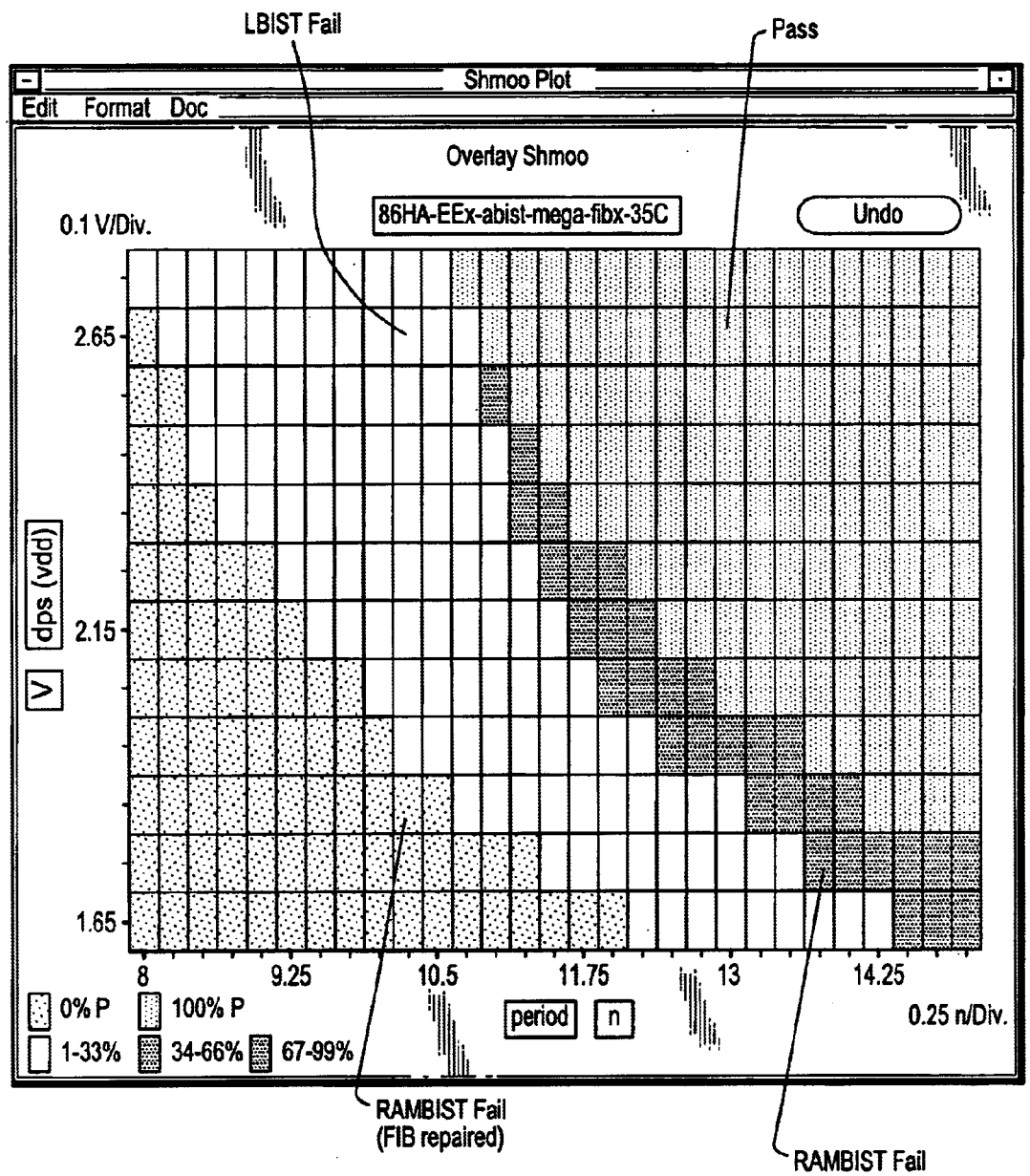
FIG. 7 is a Shmoo plot illustrating the test results from a chip that had the FIB repair done to one quadrant of one of its L1 Cache SRAM.

A description will now be given of focused ion beam (FIB) verification as a fix to the preceding problems. A fix was identified which removed the cycle to cycle timing collision between the WCON (write Control) and WCONRS (Write Control Reset) circuits. This was verified by performing a FIB fix to the circuits in question. The results of the FIB verification were a success and the cycle time of the L1 Cache SRAM was restored to where it should be. FIG. 7 is a Shmoo plot illustrating the test results from a chip that had the FIB repair done to one quadrant of one of its L1 Cache SRAM. With respect to FIG. 7, the right most portion is passing, black represents the failing L1 Cache SRAM cycle times before the repair, white represents the failing LBIST cycle times, and gray shows the faster cycle time of the FIB-repaired quadrant of the L1 Cache SRAM (which is now operating properly with a cycle-time improvement of 375 ps).

Figure 8:
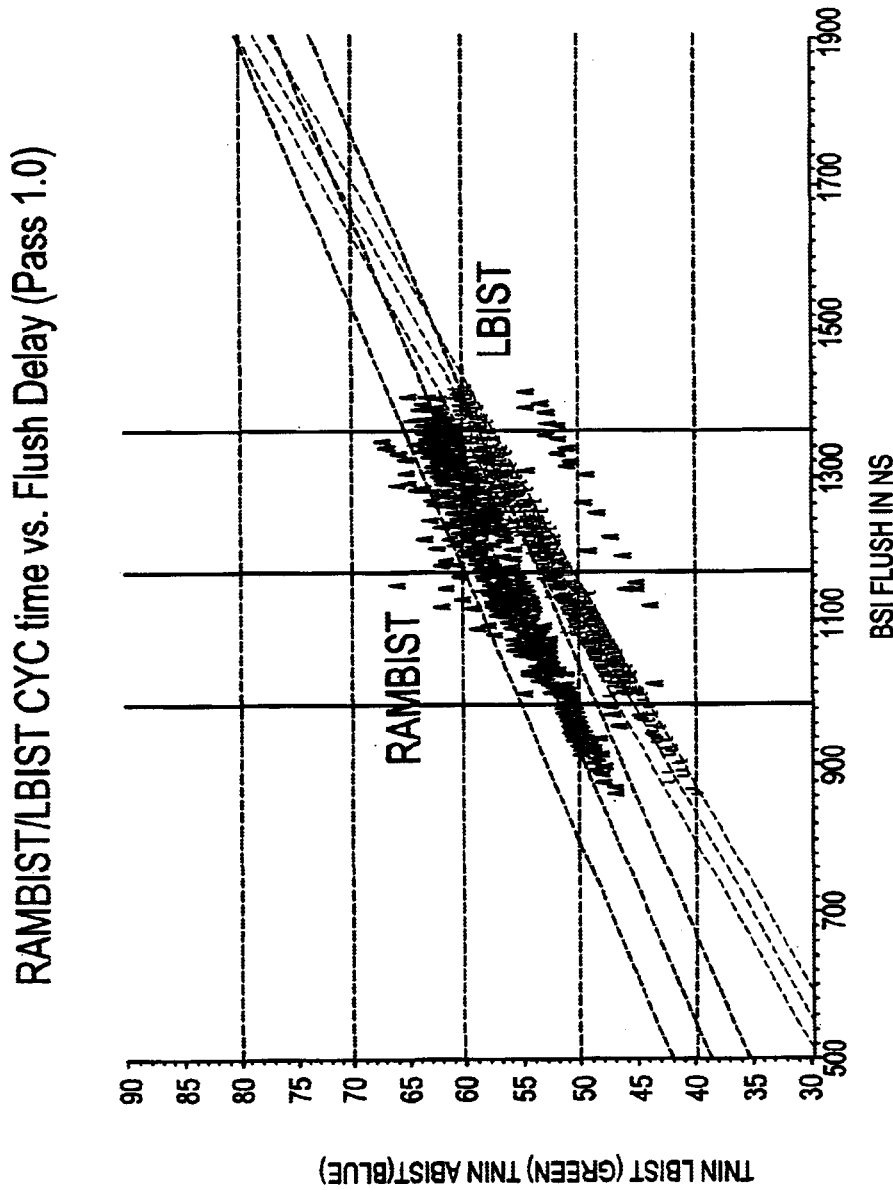
FIG. 8 is a plot of the RAMBIST and LBIST failing cycle times (Y-axis) vs. Flush Delay (X-axis) for a large number of chips in the original CMOS7S design.
Figure 9:
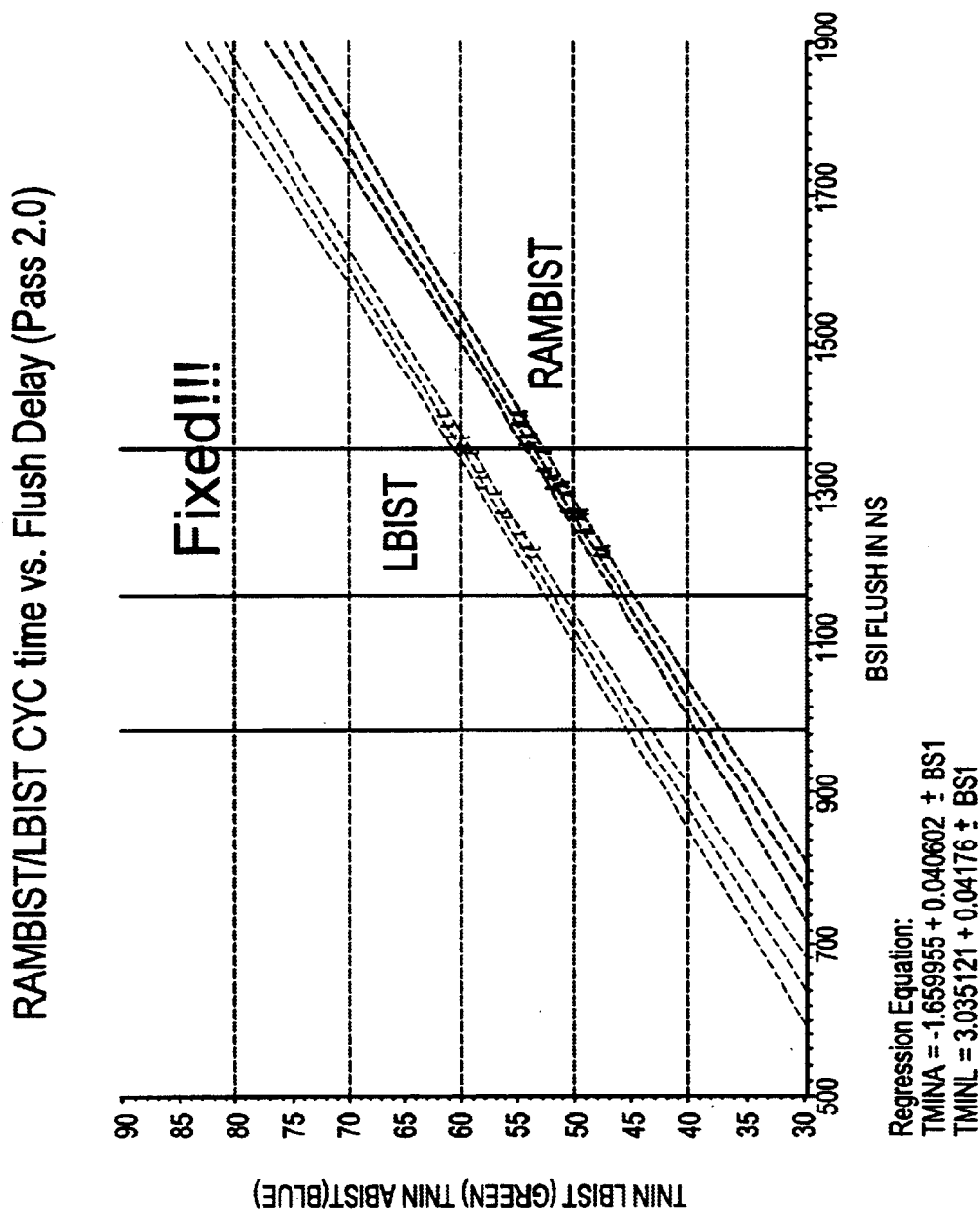
FIG. 9 is a plot of the RAMBIST and LBIST passing cycle times (Y-axis) vs. Flush Delay (X-axis) for the fixed design.

A description will now be given of a design change fix for the Mother of Holey Shmoo problem. A metal-only design change that incorporated the fix to the write control circuitry also proved to be a success. FIG. 8 is a plot of the RAMBIST and LBIST failing cycle times (Y-axis) vs. Flush Delay (X-axis) for a large number of chips in the original CMOS7S design (Pass 1.0). The Y-axis cycle time is plotted as a multiple of the on chip cycle time. Chips with faster flush delays should show faster RAMBIST and LBIST performance (cycle time). The RAMBIST is running significantly slower than LBIST for nearly all of the original design chips. FIG. 9 is a plot of the RAMBIST and LBIST passing cycle times (Y-axis) vs. Flush Delay (X-axis) for the fixed design (Pass 2.0). The RAMBIST is now running significantly faster than LBIST for all of the fixed design chips. The Mother of Holey Shmoo Problem was eliminated.

Figure 10:
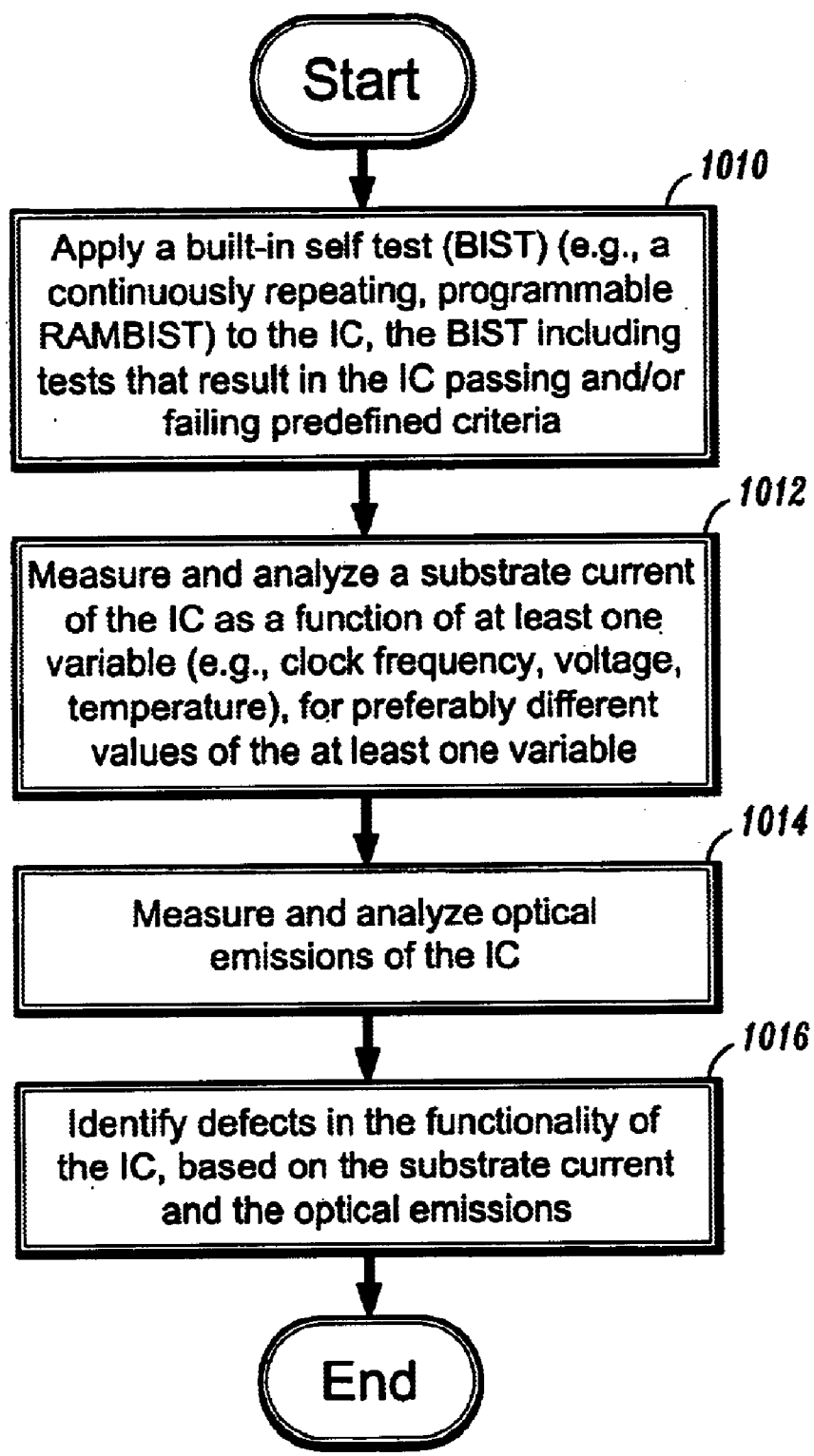
FIG. 10 is a flow diagram illustrating a method for analyzing the functionality of an integrated circuit (IC), according to an illustrative embodiment of the invention.

FIG. 10 is a flow diagram illustrating a method for analyzing the functionality of an integrated circuit (IC), according to an illustrative embodiment of the invention.

A built-in self test (BIST) (e.g., a continuously repeating, programmable random access memory built-in self test (RAMBIST)) is applied to the integrated circuit (step 1010). The BIST includes a plurality of tests that result in the integrated circuit passing and/or failing with respect to predefined criteria. Preferably, the plurality of tests are continuously repeated during application of the BIST.

During the applying step, a substrate current of the integrated circuit is measured and analyzed as a function of at least one variable (e.g., a clock frequency of the IC, an operating voltage of the IC, a temperature associated with the IC) (step 1012). Preferably, step 1012 is performed for different values of the at least one variable (e.g., fast and slow frequency). Also during the applying step, optical emissions of the integrated circuit are measured and analyzed (step 1014).

Defects in the functionality of the integrated circuit are identified, based on at least one of the substrate current and the optical emissions (step 1016).

Figure 11:
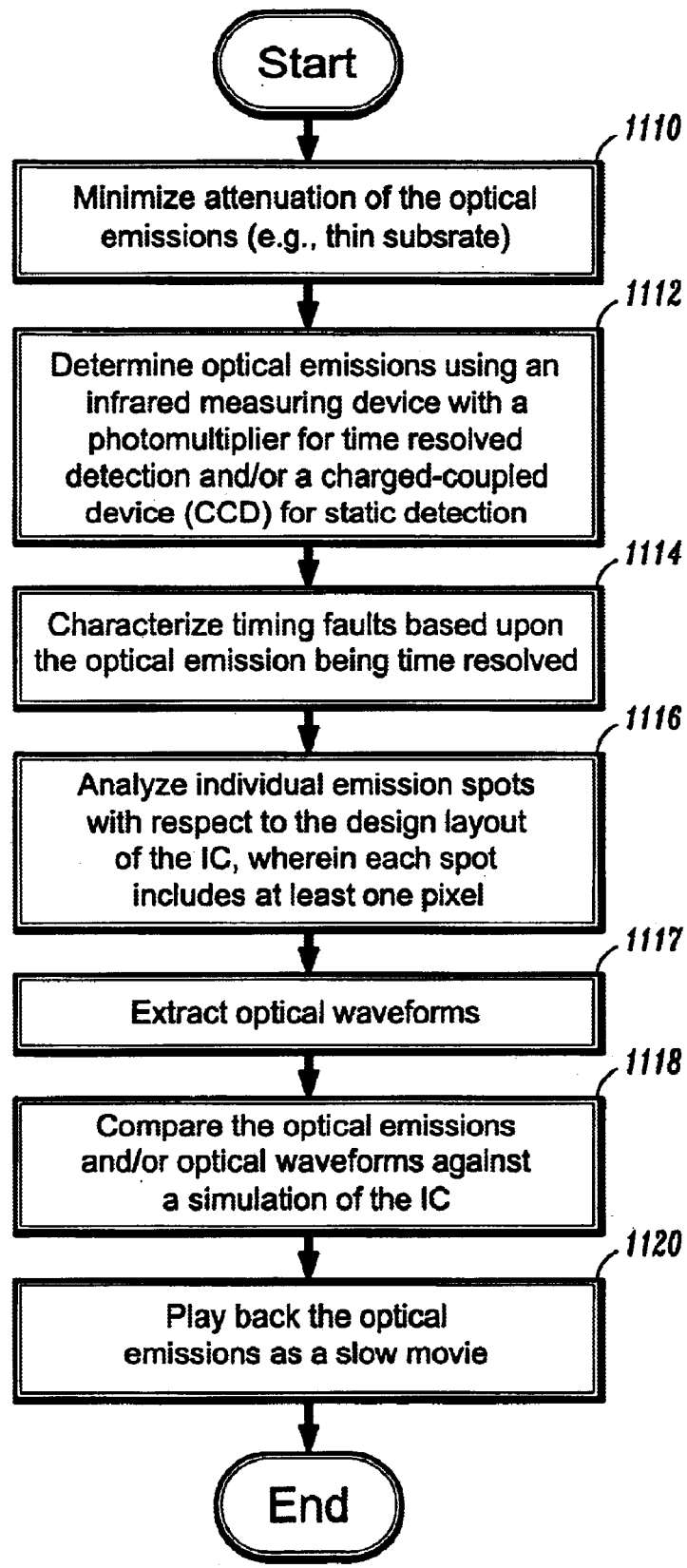
FIG. 11 is a flow diagram further illustrating step 1014 of FIG. 10, according to an illustrative embodiment of the invention.

FIG. 11 is a flow diagram further illustrating step 1014 of FIG. 10, according to an illustrative embodiment of the invention. Attenuation of the optical emissions is minimized (step 1110). This may include, but is not limited to, thinning the substrate of the integrated circuit.

The optical emissions are then determined using an infrared measuring device (e.g., a infrared microscope with varying objectives) with a photomultiplier (e.g., a microchannel plate photomultiplier) for time resolved detection of the optical emissions and/or a charge-coupled device (CCD) for time integrated detection of the optical emissions (step 1112).

Timing faults are characterized based upon the optical emissions being time resolved (step 1114). Individual emission spots are analyzed with respect to the design layout of the integrated circuit (step 1116). Each of the spots includes at least one pixel. Optical waveforms are extracted (step 1117).

The time resolved or the time integrated optical emissions and/or the optical waveforms are compared against a simulation of the integrated circuit (step 1118). The optical emissions are also played back as a slow movie (step 1120).

Although the illustrative embodiments have been described herein with reference to the accompanying drawings, it is to be understood that the invention is not limited to those precise embodiments, and that various other changes and modifications may be affected therein by one of ordinary skill in the related art without departing from the spirit and scope of the invention. All such changes and modifications are intended to be included within the scope of the invention as defined by the appended claims.

What is claimed is:

1. A method for analyzing a functionality of an integrated circuit (IC), comprising the steps of:
   applying a built-in self test (BIST) to the integrated circuit, the BIST comprising a plurality of tests that result in the integrated circuit at least one of passing and failing with respect to predefined criteria;
   during said applying step:
      measuring and analyzing a substrate current of the integrated circuit as a function of at least one variable;
      measuring and analyzing optical emissions of the integrated circuit; and
   identifying defects in the functionality of the integrated circuit, based on at least one of the substrate current and the optical emissions.

2. The method according to claim 1, wherein the at least one variable comprises at least one of a clock frequency of the integrated circuit, an operating voltage of the integrated circuit, and a temperature associated with the integrated circuit.

3. The method according to claim 1, wherein said step of measuring and analyzing the substrate current is performed for different values of the at least one variable.

4. The method according to claim 1, wherein said step of applying the BIST comprises the step of continuously repeating the plurality of tests.

5. The method according to claim 1, wherein said step of applying the BIST comprises the step of applying a continuously repeating and programmable random access memory built-in self test (RAMBIST) to the integrated circuit.

6. The method according to claim 5, wherein said step of applying the RAMBIST comprises the step of monitoring an occurrence of a fault in the integrated circuit, using a real time error bit in the RAMBIST.

7. The method according to claim 1, wherein said step of measuring and analyzing the optical emissions comprises the step of characterizing a timing fault, based upon the optical emissions being time resolved.

8. The method according to claim 1, wherein said step of measuring and analyzing the optical emissions comprises the step of minimizing attenuation of the optical emissions.

9. The method according to claim 8, wherein said minimizing step comprises the step of thinning a substrate of the integrated circuit.

10. The method according to claim 1, wherein said step of applying the BIST comprises the step of scanning instructions into an array corresponding to the plurality of tests.

11. The method according to claim 1, wherein the optical emissions include time resolved and time integrated optical emissions and the step of measuring and analyzing the optical emissions includes the step of comparing the time resolved and time integrated optical emissions against a simulation of the integrated circuit.

12. The method according to claim 1, wherein said step of measuring and analyzing the optical emissions comprises the step of playing back the optical emissions as a slow motion movie.

13. The method according to claim 1, wherein said step of measuring and analyzing the optical emissions comprises the step of determining the optical emissions using at least one of a photomultiplier, an infrared (IR) measuring device and a charge-coupled device (CCD).

14. The method according to claim 1, wherein said step of measuring and analyzing the optical emissions comprises the step of determining the optical emissions using an infrared (IR) measuring device and at least one of a photomultiplier for time resolved detection of the optical emissions, and a charge-coupled device (CCD) for static, time integrated, detection of the optical emissions.

15. The method according to claim 1, wherein said step of measuring and analyzing the optical emissions comprises the step of extracting optical waveforms.

16. The method according to claim 1, wherein said step of measuring and analyzing the optical emissions comprises the step of analyzing individual emission spots with respect to a design layout of the integrated circuit, each of the spots comprising at least one pixel.

17. The method according to claim 1, wherein the plurality of tests are executed for different values of at least one of a clock frequency of the integrated circuit, an operating voltage of the integrated circuit, and a temperature associated with the integrated circuit.

18. The method according to claim 1, further comprising the step of subtracting results of the plurality of tests executed at different frequencies.

19. A method for analyzing a functionality of an integrated circuit (IC), comprising the steps of:
    applying a built-in self test (BIST) to the integrated circuit to induce at least one of passing and failing modes of the integrated circuit;
    measuring and analyzing optical emissions of the integrated circuit in the at least one of passing and failing modes; and
    assessing the functionality of the integrated circuit based upon a result of the BIST and the optical emissions.

20. The method according to claim 19, wherein the at least one variable comprises at least one of a clock frequency of the integrated circuit, an operating voltage of the integrated circuit, and a temperature associated with the integrated circuit.

21. The method according to claim 19, wherein said step of measuring and analyzing the substrate current is performed for different values of the at least one variable.

22. The method according to claim 19, wherein said step of applying the BIST comprises the step of continuously repeating the plurality of tests.

23. The method according to claim 19, wherein said step of applying the BIST comprises the step of monitoring an occurrence of a fault in the integrated circuit, using a real time error bit in the BIST.

24. The method according to claim 19, wherein said step of measuring and analyzing the optical emissions comprises the step of characterizing a timing fault, based upon the optical emissions being time resolved.

25. The method according to claim 19, wherein said step of measuring and analyzing the optical emissions comprises the step of comparing the optical emissions against a simulation of the integrated circuit.

26. The method according to claim 19, wherein said step of measuring and analyzing the optical emissions comprises the step of determining the optical emissions using at least one of a photomultiplier, an infrared (IR) measuring device and a charge-coupled device (CCD).

27. The method according to claim 19, wherein said step of measuring and analyzing the optical emissions comprises the step of determining the optical emissions using an infrared (IR) measuring device and at least one of a photomultiplier for time resolved detection of the optical emissions, and a charge-coupled device (CCD) for static, time integrated, detection of the optical emissions.

28. The method according to claim 19, wherein said step of measuring and analyzing the optical emissions comprises the step of analyzing individual emission spots with respect to a design layout of the integrated circuit, each of the spots comprising at least one pixel.

29. The method according to claim 19, wherein the plurality of tests are executed for different values of at least one of a clock frequency of the integrated circuit, an operating voltage of the integrated circuit, and a temperature associated with the integrated circuit.

30. The method according to claim 19, further comprising the step of subtracting results of the plurality of tests executed at different frequencies.

31. A method for analyzing a functionality of an integrated circuit (IC), comprising the steps of:
    inducing error and non-error modes of operation in the integrated circuit;
    monitoring a substrate current of the integrated circuit with respect to a predefined variable at least during the error modes;
    measuring and obtaining optical emissions of the integrated circuit during the error and non-error modes; and
    characterizing the functionality of the integrated circuit, based upon the substrate current and the optical emissions.

* * * * *